United States Patent
Chittipeddi et al.

(10) Patent No.: US 6,790,757 B1
(45) Date of Patent: Sep. 14, 2004

(54) WIRE BONDING METHOD FOR COPPER INTERCONNECTS IN SEMICONDUCTOR DEVICES

(75) Inventors: Sailesh Chittipeddi, Allentown, PA (US); Sailesh Mansinh Merchant, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/467,253

(22) Filed: Dec. 20, 1999

(51) Int. Cl.$^7$ ................................................. H01L 21/44
(52) U.S. Cl. ..................... 438/612; 438/614; 438/617; 438/656; 438/661; 438/687; 438/688
(58) Field of Search ................................. 438/612, 614, 438/617, 656, 661, 687, 688, FOR 343, FOR 352

(56) References Cited

U.S. PATENT DOCUMENTS

| | | | |
|---|---|---|---|
| 4,622,576 A | | 11/1986 | Buynoski |
| 4,943,470 A | * | 7/1990 | Shiromizu et al. ........ 156/89.15 |
| 5,045,151 A | * | 9/1991 | Edell ........................ 252/79.3 |
| 5,172,212 A | | 12/1992 | Baba |
| 5,455,195 A | | 10/1995 | Ramsey et al. |
| 5,565,378 A | * | 10/1996 | Harada et al. ............ 228/180.5 |
| 5,785,236 A | | 7/1998 | Cheung et al. |
| 6,187,680 B1 | * | 2/2001 | Costrini et al. ............. 438/611 |
| 6,207,547 B1 | * | 3/2001 | Chittipeddi et al. ........ 257/758 |
| 6,265,300 B1 | * | 7/2001 | Bhansali et al. ............ 438/612 |
| 6,319,728 B1 | * | 11/2001 | Bhan et al. ................. 438/680 |
| 6,329,722 B1 | * | 12/2001 | Shih et al. .................. 257/786 |

FOREIGN PATENT DOCUMENTS

| | | |
|---|---|---|
| EP | 0 178 170 | 4/1986 |
| EP | 0 849 797 A2 | 6/1998 |
| EP | 1 022 776 A2 | 7/2000 |
| GB | 903476 | 8/1962 |
| GB | 1 294 770 | 11/1972 |
| JP | 62-216339 | 9/1987 |
| JP | 1-255234 | 10/1989 |
| JP | 0 365 919 | 5/1990 |
| JP | 5-251494 | 9/1993 |
| WO | WO 01/01478 A1 | 6/2000 |
| WO | WO 00/59029 | 10/2000 |

OTHER PUBLICATIONS

Harper, Charles A., "Electronic Packaging and Interconnection Handbook", 1991 by McGraw–Hill, p. 10.47.*

Tummala et al., "Microelectronics Packaging Handbook", Section 6.3, pp. 366–382, Van Norstrand Reinhold, New York, 1989.

* cited by examiner

Primary Examiner—George Fourson
Assistant Examiner—Michelle Estrada

(57) ABSTRACT

The present invention uses wire bonding technology to bond interconnect materials that oxidize easily by using a wire with stable oxidation qualities. A passivation layer is formed on the semiconductor substrate to encapsulate the bonding pad made from the interconnect material such that the wire bonds with the passivation layer itself, not with the interconnect material. The passivation layer is selected to be a material that is metallurgically stable when bonded to the interconnect material. Since the wire is stable compared with the interconnect material, i.e., it does not readily corrode, a reliable mechanical and electrical connection is provided between the semiconductor device (interconnect material) and the wire, with the passivation layer disposed therebetween.

16 Claims, 5 Drawing Sheets

WIRE BONDING METHOD FOR COPPER INTERCONNECTS IN SEMICONDUCTOR DEVICES

FIELD OF THE INVENTION

The invention relates to the field of integrated circuits (IC) and semiconductor devices. In particular, the invention relates to wire bonding of copper interconnects when integrating microelectronic circuits with semiconductor devices.

BACKGROUND OF THE INVENTION

Packaging is a basic process in semiconductor manufacturing. Packaging of electronic circuits provides interconnections and a suitable operating environment for predominantly electrical circuits to process or store information. Electronic packages contain many electrical circuit components, e.g., resistors, capacitors, diodes and transistors. In order to form circuits, these components require interconnections.

As information systems store and process large amounts of information, a large number of circuits and interconnections is needed. In meeting that need, chips are interconnected onto plastic, ceramic or coated-metal first-level packages. The electrical connections between chip and package, referred to as chip-level interconnections, are commonly performed using various chip bonding technologies, such as wire bonding and flip-chip technologies. The choice of chip bonding technology depends on the number and spacing of input/output (I/O) connections on the chip and the substrate, interconnect material selection, as well as permissible cost.

In wire bonding, very fine wires are attached to semiconductor components in order to interconnect these components with each other or with package leads. Its widespread use is primarily based on the fact that a large number or density of chip connections can be achieved with this technology, while at the same time providing a low cost per connection. Use of wire bonding is generally limited to chip bonding aluminum-based interconnect materials.

Flip-chip technology is often utilized over wire bonding for increased input/output (I/O) efficiency and greater speed in the IC since interconnect delays are minimized. In flip-chip bonding, a leadless, monolithic structure contains circuit elements designed to electrically and mechanically interconnect to a circuit by means of an appropriate number of bumps located on the face of a chip, which are covered by a conductive bonding agent.

Conventional designs utilize aluminum (Al) or aluminum alloys as the basic interconnect material for bonding pads in chip bonding. There is a trend in the art, however, to migrate from aluminum-based interconnect materials to other substances such as Copper (Cu). Copper, with its low resistivity, is an excellent material for the ever smaller wires in integrated circuits and provides better circuit performance and device reliability. Copper, nevertheless, has properties that are detrimental to semiconductor devices because it readily oxidizes in air at typical operating temperatures. Copper is also highly corrosive and contaminates semiconductor devices quickly if it is not isolated from other materials in the semiconductor. Due to these chemically active properties of copper, it is not feasible to utilize wire bonding when chip bonding copper interconnect materials. Consequently, the convention in the art is to utilize the flip-chip method to chip bond copper interconnects.

FIG. 1 illustrates a conventional flip-chip bonding process. The conventional flip-chip bonding process is described in *Microelectronics Packaging Handbook*, Rao R. Tummala and Eugene J. Rymaszewski (eds.), Van Nostrand Reinhold, New York (1989), pages 366–382. Referring to FIG. 1, flip-chip bonding utilizes solder bumps 12 deposited on wettable metal terminals on a Chip 14 and a matching array or arrangement of solder wettable terminals 16 on Substrate 18. Chip 14, which is upside-down, is aligned with Substrate 18, and solder joints formed by solder bumps 12 and metal terminals 16 are made simultaneously by heating and reflowing solder bumps 12.

Flip-chip technology is more expensive than wire bonding and requires a higher capital cost in process equipment. Moreover, compared with wire bonding, flip-chip technology requires additional process steps. For example, flip-chip bonding requires an underbump metallization structure that has to be deposited and patterned prior to the formation of the solder bumps. The underbump metallurgy often contains three or more complex metallization layers that must be deposited and patterned. The additional deposition processes result in increased cost in manufacturing the semiconductor device, often requiring additional assembly work performed in-house or by outside contractors. Moreover, the patterning processes require complex lithographic and etching process steps that add to the manufacturing cost. Furthermore, complex processes are necessary for the fabrication of the solder bumps which require solder deposition, patterning and reflow process steps.

Therefore, what is needed in the art is an optimized method of manufacturing semiconductor devices with copper interconnects, and more particularly, a method that is more cost efficient than flip-chip technology but uses manufacturing equipment commonly available in the art (such as equipment conventionally available in wire bonding).

SUMMARY OF THE INVENTION

The present invention uses wire bonding technology to bond interconnect materials that oxidize easily by using a wire with stable oxidation qualities. A passivation layer is formed on the semiconductor substrate to encapsulate the bonding pad made from the interconnect material such that the wire bonds with the passivation layer itself, not with the interconnect material. The passivation layer is selected to be a material that is metallurgically stable when bonded to the interconnect material. Since the wire is stable compared with the interconnect material, i.e., it does not readily corrode, a reliable mechanical and electrical connection is provided between the semiconductor device (interconnect material) and the wire, with the passivation layer disposed therebetween.

The invention is economically advantageous that it utilizes a relatively low-cost wire bonding technology, which does not require additional equipment and capital investment. In addition, the invention efficiently completes the chip bonding process without requiring extra metallization steps.

BRIEF DESCRIPTION OF THE DRAWINGS

Other features and advantages of the invention will be apparent from the following detailed description when read in conjunction with the accompanying drawings. The drawings are intended to illustrate only one portion of an integrated circuit fabricated in accordance with the invention and will be understood as not being drawn to scale except if specifically noted, the emphasis instead being placed upon illustrating the principles of the invention. In the accompanying drawings.

DETAILED DESCRIPTION OF THE PREFERRED EMBODIMENTS

Conventional designs utilize aluminum (Al) or aluminum alloys as the basic interconnect material for bonding pads in chip bonding. Aluminum-based materials are used because of their oxidation/passivation qualities and their ease of construction with economical technologies such as wire bonding. The current trend in the art, however, is a migration from aluminum-based interconnect materials to other substances such as Copper (Cu). Copper, with its low resistivity, is an excellent material for the ever smaller wires in integrated circuits and provides better circuit performance and device reliability. Use of copper as the interconnect material is desirable because it significantly lowers the resistance of the interconnect systems.

Copper, nevertheless, has properties that are detrimental to semiconductor devices because it readily oxidizes in air at typical operating temperatures. Copper is also highly corrosive and contaminates semiconductor devices quickly if it is not isolated from other materials in the semiconductor. Because of these chemically active qualities of copper, it is simply not feasible to use wire bonding when chip bonding copper interconnects. As a result, even though wire bonding is more economical, the convention in the art is to use flip-chip technology when chip bonding copper interconnect materials.

Figure 1:
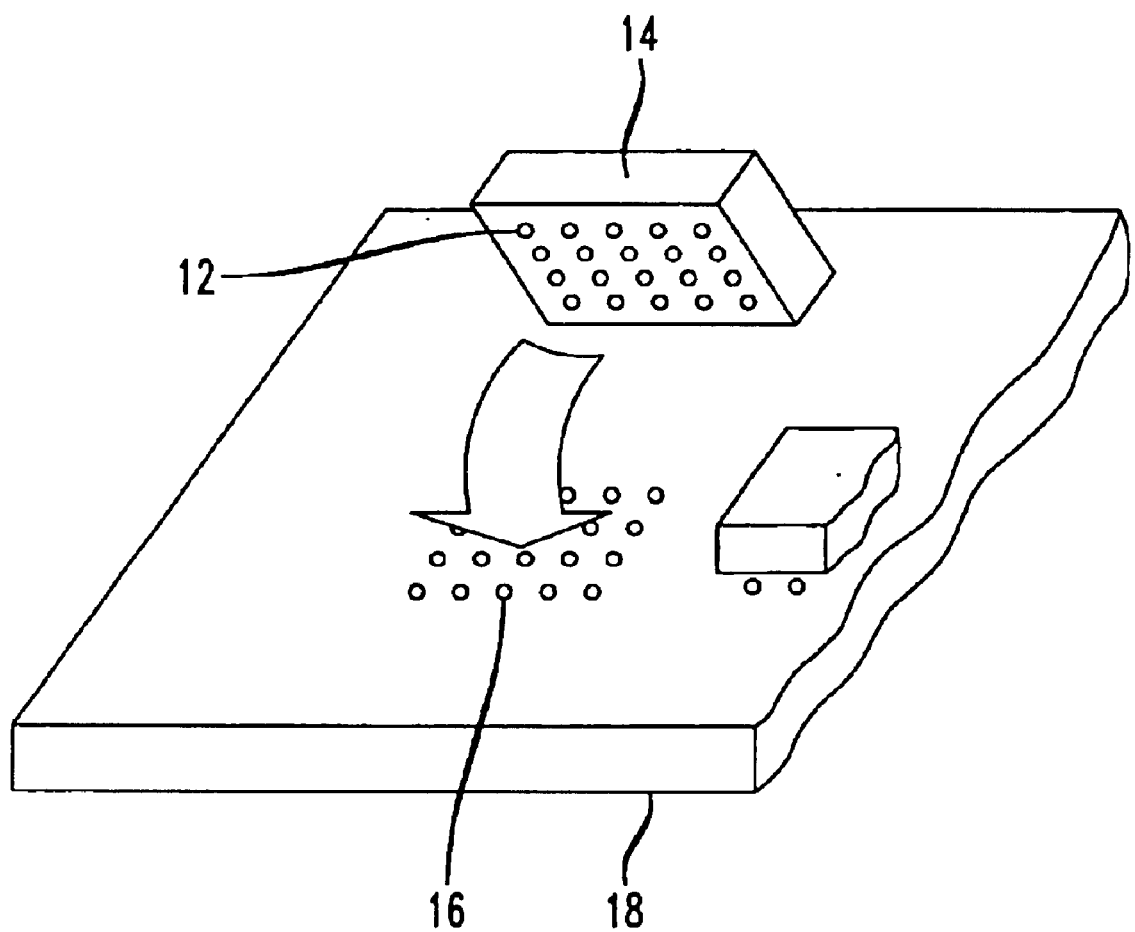
FIG. 1 illustrates a conventional flip-chip bonding process.
Figure 2A:
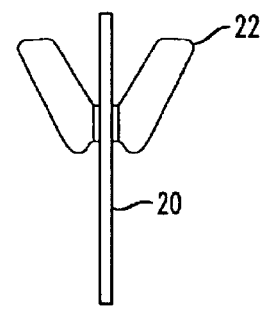
FIGS. 2(a), 2(b), 2(c) and 2(d) illustrate a conventional wire bonding process.
Figure 2B:
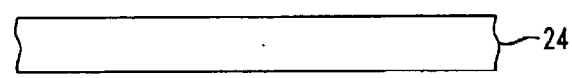
Figure 2C:
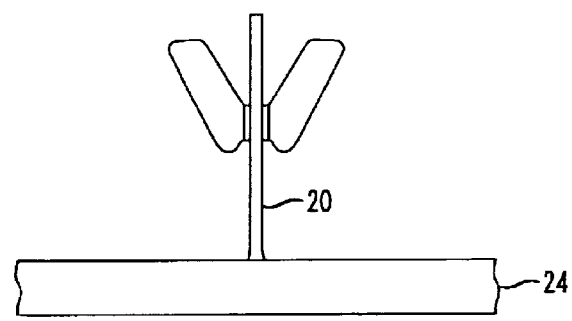
Figure 2D:
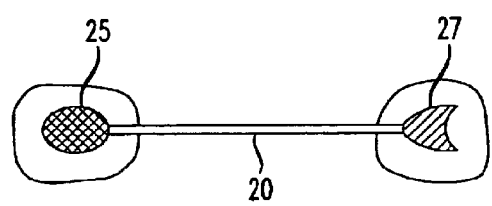

FIGS. 2(a), 2(b), 2(c) and 2(d) illustrate a conventional wire bonding method as utilized in a bonding process. Bonding is generally performed using a gold (Au) wire. The wires are bonded, one at a time, to the substrate. FIG. 2(a) illustrates a gold wire 20 in a capillary 22 that is ready for bonding to the substrate 24. Referring to FIG. 2(b), the substrate 24 is heated and the gold wire 20 is wedge bonded onto the substrate 24 in accordance with conventional wedge bonding methods. FIGS. 2(c) and 2(d) illustrate the top view and side view, respectively, of the ball bond and wedge bond formed in the conventional process. The bonding can be accomplished by simultaneously applying a vertical load or ultrasonically exciting the gold wire. Referring to FIG. 2(d), the connecting wire 20 connects the ball bond 25 of the first bonding site on the left, e.g., an input/output (I/O) pad on a semiconductor device (26), and the wedge bond 27 on the second bonding site on the right, e.g., an I/O pad on a package, lead frame or any other substrate (28).

For better circuit performance and cost-effectiveness, copper can be used as the interconnect material for the bonding pad on the substrate, instead of aluminum. However, it is simply not feasible to bond the wire directly to copper because copper contaminates very easily, and quickly forms a dense oxide layer that cannot be penetrated with gold or aluminum-based wire bonding technologies. The existing technologies work for the bonding of either gold wires or aluminum wires to aluminum interconnects. Nevertheless, the existing technologies do not work for the bonding of gold or aluminum wires to copper interconnects, since copper is easily oxidized. The convention in the art is to abandon wire bonding altogether and use flip-chip technology to bond the wire with copper interconnect material.

Reference is now made in detail to an embodiment of the invention that illustrates the best mode presently contemplated by the inventors for practicing the invention. Other embodiments are also described herein.

The invention provides a novel method of using wire bonding technology for bonding the wire with interconnect material such as copper that otherwise oxidizes easily. According to the invention, a passivation layer is formed to encapsulate the interconnect material such that the wire bonds with the passivation layer, but not with the interconnect material. The passivation layer is selected to form a stable metallurgical bond with the interconnect material. As a result, a reliable mechanical and electrical connection is provided between the semiconductor device (interconnect material) and the wire, with the passivation layer disposed therebetween.

In a specific embodiment of the invention, tantalum (Ta) is used to encapsulate the copper interconnect material. An aluminum (or aluminum alloy) wire, as opposed to a gold wire, is used in the wire bonding process. The aluminum (Al) wire bonds well with the Ta layer, instead of the Cu interconnect, and forms an intermetallic compound tantalum aluminide ($TaAl_3$). The Cu bond pad is fabricated using techniques well known in the art for wire bonding with the Al wire. The Ta layer is then deposited onto the substrate, patterned and etched to encapsulate the Cu bond pad. The Ta layer performs the function of a passivation layer, protecting the underlying Cu bond pad and interconnect material. A stable metallurgical compound, $TaAl_3$, is then formed between the Ta layer and the Al wire.

Figure 3A:
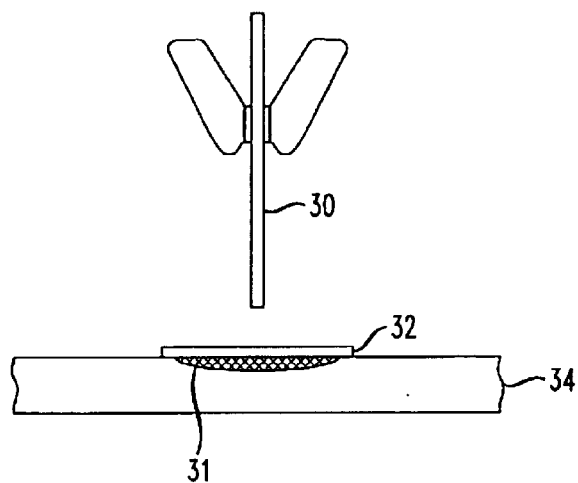
FIGS. 3(a), 3(b), 3(c) and 3(d) illustrate the methodology of the present invention used in a wedge bonding process.
Figure 3B:
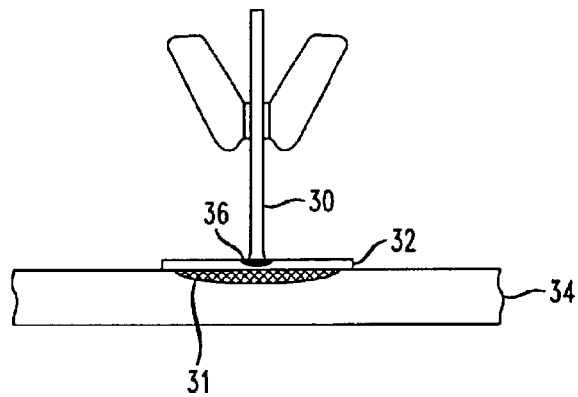

FIGS. 3(a), 3(b), 3(c) and 3(d) illustrate a wedge bonding process according to the invention. As shown in FIG. 3(a), the wire 30 used in this wedge bonding process is an Al wire. Note that an aluminum alloy wire can also be used in the wedge bonding process according to the invention. A passivation layer 32 is overlaid on the surface of the substrate 34, encapsulating the Cu interconnect 31. Referring to FIG. 3(b), a wedge bond 36 between the Al wire 30 and the substrate 34 is formed under load or ultrasonic excitation. Note that the wedge bond 36 is not directly formed on the surface of the Cu interconnect 31. Instead, the wedge bond 36 is formed in the Ta passivation layer 32, which encapsulates the Cu interconnect 31. The Ta layer 32 bonds well with the Al wire 30 as it forms an intermetallic compound $TaAl_3$, which facilitates the forming of a strong metallurgical bond (i.e., wedge bond 36) with the Cu interconnect 31.

Figure 3C:
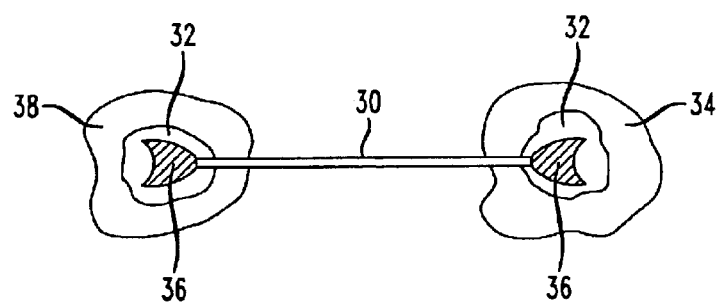
Figure 3D:
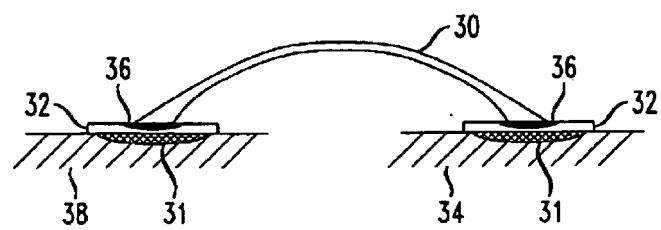

FIGS. 3(c) and 3(d) show top and side views, respectively, of the wedge bond 36 and the Ta passivation layer 32. The wedge bond formed at both bonding sites, along with Al wire 30, connects the first bonding site on the left, e.g., an input/output (I/O) pad on a semiconductor device (38), and the second bonding site on the right, e.g., an I/O pad on a package, lead frame or any other substrate (34).

The thickness of the Ta layer 32 is selected such that it reacts with the Cu bond pad to form a metallurgical bond, and also reacts with the Al wire 30. In a preferred embodiment of the present invention, the thickness of the Ta layer 32 is between 300 to 1000 angstroms (Å). A portion of the Ta layer 32 bonds with the Cu bond pad, while another portion thereof forms the $TaAl_3$ compound. Much of the Ta passivation layer 32 is consumed to form $TaAl_3$. The unreacted portion of the Ta layer 32 forms a sound metallurgical and mechanical bond with the Cu bond pad.

In an alternate embodiment of the present invention, Al-coated gold (Au) wire can also be used in the wedge bonding process. In yet another embodiment, an external heat treatment of 200 to 400 Celsius is performed immediately after the wire bonding process to ensure the formation of a sound. bond.

Figure 4:
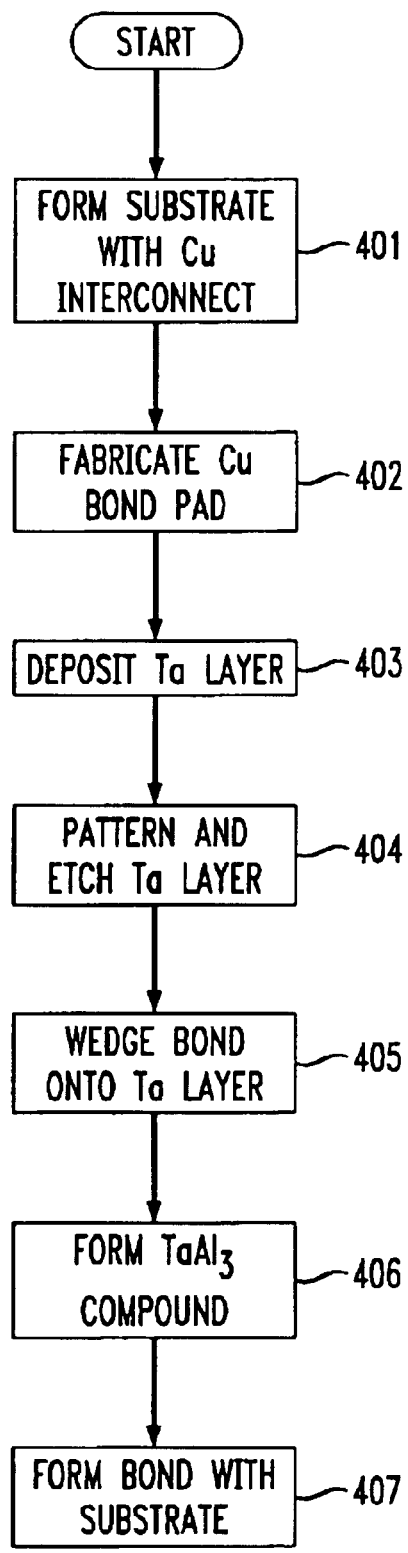
FIG. 4 is a flow diagram illustrating the methodology of the present invention.

FIG. 4 is a flow diagram that illustrates the methodology of the invention. Referring to FIG. 4, a substrate with Cu interconnect is first formed in Step 401. The Cu bond pad is fabricated in Step 402. The Ta layer is deposited onto the substrate in Step 403. The Ta layer is then patterned and etched to encapsulate the Cu bond pad in Step 404. Patterning techniques may include negative tone pad masking and photoresist patterning. The patterning process may be performed during deposition using metal masks or lift-off techniques. The patterning can also be done by photolithography and etching of a blanket deposition.

Referring to Step 405, the Al wire is wedge bonded with the Ta layer. An intermetallic compound $TaAl_3$ is formed in Step 406. A portion of the Ta layer bonds with the Cu bond pad, while another portion thereof forms the $TaAl_3$ compound (Step 406). Much of the Ta layer is consumed to form $TaAl_3$. The unreacted portion of the Ta layer forms a sound metallurgical and mechanical bond with the Cu bond pad (Step 407). A strong wire bond between the Al wire and the substrate, with the Cu interconnect, the Ta layer and $TaAl_3$ compound therebetween, is formed. Note that many variations of films (such as thin or thick film processes) and materials can be used in implementing the methodology of the invention.

Figure 5A:
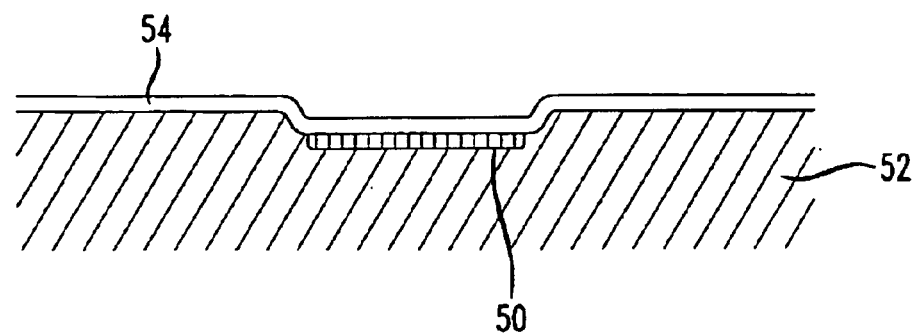
FIGS. 5(a) and 5(b) illustrate another embodiment of the present invention in which the methodology of the invention is applied to a semiconductor device using a bonding pad.
Figure 5B:
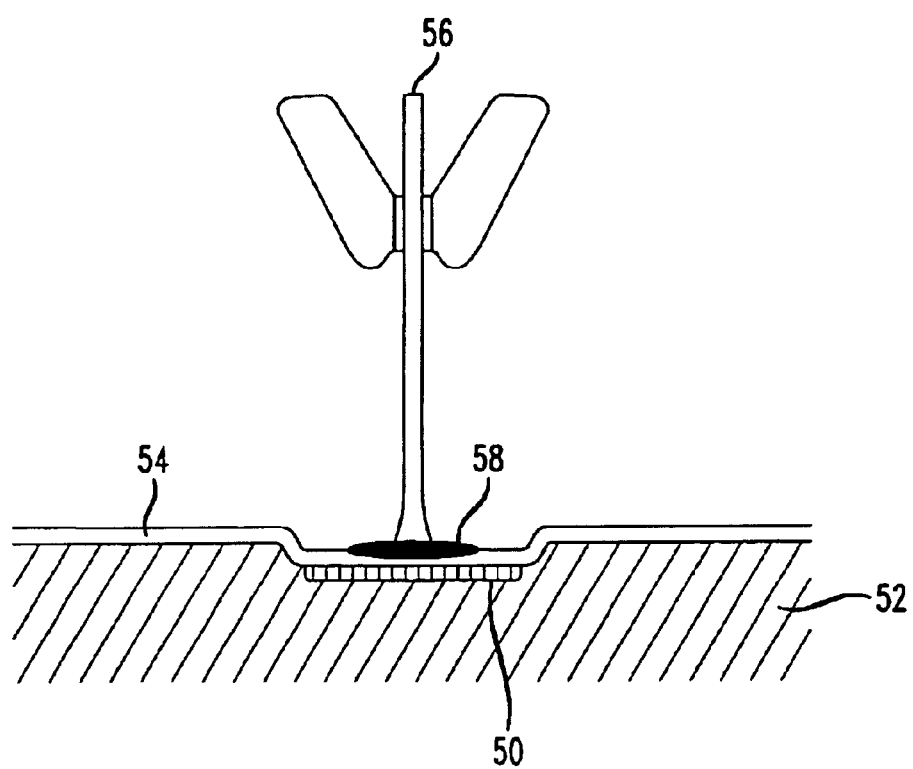

FIGS. 5(*a*) and 5(*b*) illustrate a specific embodiment of the invention as applied to a semiconductor device that uses Cu interconnect material as the bonding pad for wire bonding. Referring to FIG. 5(*a*), a, Bonding Pad 50 is formed on a Substrate 52 (which can be any IC structure) using metal (e.g., Cu) interconnect as the bonding pad. A passivation layer (54) of Ta is then deposited onto Substrate 52, encapsulating the Cu interconnect. Substrate 52 may comprise a semiconductor substrate having devices formed therein. Substrate 52 may also include a multi-layered interconnect structure formed over the semiconductor substrate connecting the devices. Furthermore, the multi-layered interconnect structure may comprise multiple levels of metal interconnects, e.g., Cu interconnect. The Cu interconnect may be formed by a damascene process or by dry etching.

FIG. 5(*b*) is an illustration of the wedge bonding of the invention as applied to a semiconductor device using Cu interconnect as the bonding pad. A bond (58) is formed at the point of contact between Al Wire 56 and Bonding Pad 50 overlaying Substrate 52. Instead of wire bonding to Bonding Pad 50 directly, Al Wire 56 and Passivation Layer 54 of Ta forms an $TaAl_3$ intermetallic compound. The $TaAl_3$ compound, which is a part of Wedge Bond 58, forms on top of Passivation Layer 54 to bond Al Wire 56 to Substrate 52. Substrate 52 may then be packaged in a plastic or hermetic package.

The invention is economically advantageous that it utilizes a relatively low-cost wire bonding technology, which does not require additional equipment and capital investment. In addition, the invention efficiently completes the chip bonding process without requiring extra metallization steps. Thus, erosive oxidation effects of interconnect materials are prevented in a cost-effective and process-efficient manner.

While the invention has been particularly shown and described with reference to the preferred embodiments thereof, the embodiments are not intended to be exhaustive or to limit the invention to the precise forms disclosed herein. It will be understood by those skilled in the art that various changes in form and detail may be made therein without departing from the spirit and scope of the invention. Similarly, any process steps described may be interchangeable with other steps in order to achieve substantially the same result. The scope of the invention is defined by the following claims and their equivalents.

We claim:

1. A wire bonding method, comprising the steps of:

forming a semiconductor substrate with a copper (Cu) interconnect material;

fabricating a copper (Cu) bond pad from the interconnect material;

depositing a homogenous tantalum (Ta) layer onto the substrate and over the copper (Cu) bond pad;

patterning and etching the tantalum (Ta) layer, the tantalum (Ta) layer encapsulating the copper (Cu) bond pad; and bonding an aluminum (Al) wire to the tantalum (Ta) layer over the bond pad; and wherein a portion of the tantalum (Ta) layer forms an intermetallic bond with the copper (Cu) bond pad, and another portion of the tantalum (Ta) layer forms a tantalum aluminide ($TaAl_3$) compound to intermetallically bond the aluminum wire to the tantalum (Ta) layer.

2. The method of claim 1, wherein the wire is a wire selected from the group consisting of an aluminum wire, an aluminum alloy wire, and an aluminum-coated gold wire.

3. The method of claim 1, wherein thickness of the tantalum (Ta) layer is controlled such that a portion of the tantalum (Ta) layer bonds with the copper (Cu) bond pad, and another portion of the tantalum (Ta) layer forms a tantalum aluminide ($TaAl_3$) compound.

4. The method of claim 1, wherein thickness of the tantalum (Ta) layer is between 300 to 1000 angstroms (Å).

5. The method of claim 1, wherein the aluminum (Al) wire is bonded onto the tantalum (Ta) layer by wedge bonding.

6. The method of claim 1, further comprising the step of performing a heat treatment after the bonding step.

7. The method of claim 1, further comprising the step of packaging the substrate in a package consisting of a plastic package and a hermetic package.

8. The method of claim 1, wherein the tantalum (Ta) layer is patterned by a method consisting of negative tone pad masking, photoresist patterning, and photolithography.

9. The method of claim 1, wherein the substrate is a multi-layered interconnect structure.

10. A wire bonding method, comprising the steps of:

forming a bond pad made from an interconnect metal on a semiconductor substrate;

encapsulating said bond pad with a homogenous metal passivation layer;

bonding a wire onto the metal passivation layer, the metal passivation layer including a metal different from the wire;

wherein a portion of the metal passivation layer forms an intermetallic bond with the interconnect metal, and wherein another portion of the metal passivation layer forms a different intermetallic bond with the wire; and wherein a mechanical and electrical connection is provided between the interconnect metal and the wire, with the metal passivation layer disposed therebetween.

11. The method of claim 10, wherein the wire is a wire selected from the group consisting of an aluminum wire, an aluminum alloy wire, and an aluminum-coated gold wire.

12. The method of claim 10, wherein the passivation layer is a tantalum (Ta) layer.

13. The method of claim 10, wherein the wire is bonded onto the passivation layer by wedge bonding.

14. The method of claim 10, further comprising the step of performing a heat treatment after the bonding step.

15. The method of claim 10, wherein the substrate is a multi-layered interconnect structure.

16. The method of claim 1 wherein the step of depositing the tantalum (Ta) layer encapsulates the copper (Cu) bond pad.

* * * * *